United States Patent [19]

Vermesse

[11] Patent Number: 4,916,626
[45] Date of Patent: Apr. 10, 1990

[54] COUPLING CIRCUIT FOR NON-VOLATILE MEMORIES IN AN ELECTRONIC MACHINE, AND FRANKING MACHINE APPLYING SAID CIRCUIT

[75] Inventor: Bernard Vermesse, L'Hay Les Roses, France

[73] Assignee: Societe Anonyme dite : SMH Alcatel, Paris, France

[21] Appl. No.: 174,756

[22] Filed: Mar. 29, 1988

[30] Foreign Application Priority Data

Mar. 31, 1987 [FR] France .................................. 87 04480

[51] Int. Cl.⁴ ............................................ G06F 15/20
[52] U.S. Cl. ..................... 364/480; 324/73.1; 364/464.02; 371/21.1
[58] Field of Search .............. 364/464.03, 466, 464.02, 364/480, 481, 580; 371/21, 21.1; 324/73 R

[56] References Cited

U.S. PATENT DOCUMENTS

| | | | |
|---|---|---|---|
| 4,070,565 | 1/1978 | Borrelli | 364/580 X |
| 4,335,441 | 6/1982 | Baumann et al. | 364/464.02 X |
| 4,450,560 | 5/1984 | Conner | 371/21.1 X |
| 4,455,654 | 6/1984 | Bhaskar et al. | 371/16.2 |
| 4,481,627 | 11/1984 | Beauchesne et al. | 371/21.1 |
| 4,623,974 | 11/1986 | Denz et al. | 364/551.01 |

FOREIGN PATENT DOCUMENTS

| | | |
|---|---|---|
| 0042749 | 12/1981 | European Pat. Off. . |
| 0051332 | 5/1982 | European Pat. Off. . |
| 0085385 | 8/1983 | European Pat. Off. . |
| 3437980 | 4/1986 | Fed. Rep. of Germany . |
| 2032244 | 11/1970 | France . |
| 2173738 | 10/1986 | United Kingdom . |

*Primary Examiner*—Parshotam S. Lall
*Assistant Examiner*—Edward R. Cosimano
*Attorney, Agent, or Firm*—Sughrue, Mion, Zinn, Macpeak & Seas

[57] ABSTRACT

The invention relates to a circuit for coupling volatile memories to a microprocessor or to a test tool having a test connector suitable for connection to a second complementary connector which is connected to the links between the memories and the microprocessor. The circuit is characterized in that the second connector (17) is mounted as a terminal connector on the links going to the memories (11, 12), and in that it further includes a third connector (18) mounted as a terminal connector on the links going to the microprocessor (13), together with a removable connection circuit (20) for providing connections between said second and third connectors. The invention is particularly suitable for a franking machine.

8 Claims, 3 Drawing Sheets

COUPLING CIRCUIT FOR NON-VOLATILE MEMORIES IN AN ELECTRONIC MACHINE, AND FRANKING MACHINE APPLYING SAID CIRCUIT

REFERENCE TO RELATED APPLICATIONS

This application relates to application Ser. No. 174,759 filed March 29, 1988, entitled "A LIMITED WRITE NON-VOLATILE MEMORY AND A FRANKING MACHINE MAKING USE THEREOF", to the same applicant and assigned to the commom assignee and application Ser. No. 174,755, filed March 29, 1988, entitled "A FRANKING MACHINE PROVIDING A PERIODIC HISTORICAL TRAIL", to the same applicant and also assigned to the common assignee.

The present invention relates to a way of coupling non-volatile memories in an electronic machine, in particular a franking machine which is totally or partially electronic.

BACKGROUND OF THE INVENTION

In current franking machines, the electronic equipment is organized in conventional manner about a program-controlled microprocessor. The microprocessor updates, in particular, one or more non-volatile memories assigned to recording the total value of franking operations performed, and also, at least in pre-payment franking machines, the values of successive amounts of credit loaded into the machine together with the amount of credit remaining available in the machine. The non-volatile memory which records these accounts is referred to as the machine meter memory or as the machine state memory.

Given the amount of money represented by each franking machine and even more so the amount of money represented by all franking machines in operation, it is essential that such machines should include sufficient redundancy and checking to be able to detect any kind of anomalous operation.

One simple and well-known means for this purpose consists in providing two non-volatile memories and recording the machine meter state twice over in separate manner. If a difference is detected between the contents of the two memories, then the machine is put into a fault state. The machine locks up and further franking becomes impossible.

In the event of a fault caused by a breakdown or failure of the components in the electronic equipment or due to an attempted fraud, it is necessary to rediscover the meter state prior to the occurrence of the fault. To this end, the meter state is recorded in each memory with a large amount of redundancy. In particular, a record is made in each non-volatile memory of the up meter which gives the total value of all franking operations performed, the down meter which gives the remaining amount of credit available, and the cumulative meter which gives the total amount of credit successively loaded into the machine, thereby enabling arithmetic checks to be performed between these three meters. Often, each of these three meters is associated with an error detection code related to the state of each meter and recorded therewith in each memory. Such redundancy shows up a faulty memory. The same redundancy can also be used in a non-negligible number of cases to conclude that the machine is not at fault and also that there has been no attempt at fraud, but simply that the memories have fallen out of step with each other, which can be rectified fairly simply. The operation of the machine may have been disturbed by transient disturbances from various possible origins, e.g. electromagnetic or electrostatic origins, etc.

A test procedure is provided for rediscovering the state of the meter prior to the appearance of the fault and also, possibly, for diagnosing that the memories have merely fallen out of step. The test procedure is performed in the presence of the user and of a representative of the postal service. The franking machine which was initially sealed is unsealed in order to gain access to the non-volatile memories.

During this test procedure, a device called a test tool is used to read the contents of the memories, to compare the contents in order to show up differnces, and to verify redundancies so as to show up a memory that is faulty, if any. In general, the test tool is fitted with a test connector which is connected thereto by a cord, and the franking machine is fitted with an internal connector complementary to the test connector and connected in parallel on the links between the access terminals of the memories and the access terminals of the electronic equipment, and in particular of the microprocessor.

The test tool thus gains access to the memories by having its test connector connected to the complementary connector provided for the purpose in the machine and made available when the machine is unsealed.

In theory, such access to non-volatile memories is simple. However, it requires isolating resistances to be included in the links between the memories and the electronic equipment. These isolating resistances are there to prevent a possibly faulty portion of the electronic equipment from imposing a wrong voltage level on the links, e.g. a high level or a low level such as ground. The resistances must also make it possible to read the non-volatile memories even if the machine is not powered, for example if its power supply has broken down. Under such conditions, the test tool injects current into the resistances such that if these resistances are connected to a low level on the electronic equipment side they are raised to a sufficiently high level on the memory side to allow the memories to operate properly.

The object of the present invention is to avoid the constraints and drawbacks related to such coupling between the non-volatile memories and the electronic equipment, and also between the non-volatile memories and the test too, while making it possible to obtain selective coupling between the memories and the electronic equipment or the test tool.

SUMMARY OF THE INVENTION

The present invention therefore provides a circuit for coupling non-volatile memories in an electronic machine, the circuit enabling said memories to be coupled to a microprocessor equipment of said machine and also to be coupled to an external test tool having a first terminal connector referred to as a test connector, the circuit comprising links connected to the access terminals of said memories and to the access terminals of said equipment for coupling thereto, and a second connector complementary to the test connector which is connected to said links, the circuit being characterized in that said second connector is mounted directly as a terminal connector on said links going to said memories and interrupts their connection to said microprocessor equipment, and in that it further includes a third connector mounted directly as a terminal connector on said links going to the microprocessor equipment, and a connection circuit removably mounted between said second and third connectors, thereby selectably providing direct coupling between corresponding pins of the second and third connectors in order to ensure continuity in the links between the memories and the equipment when said connection circuit is interposed between said second and third connectors, and enabling the test connector to be connected to said second connector while isolating said memories from one another and from said equipment, when said connection circuit is removed therefrom.

BRIEF DESCRIPTION OF THE DRAWINGS

An embodiment of the invention is described by way of example with reference to the accompanying drawings, in which.

MORE DETAILED DESCRIPTION

Figure 1:
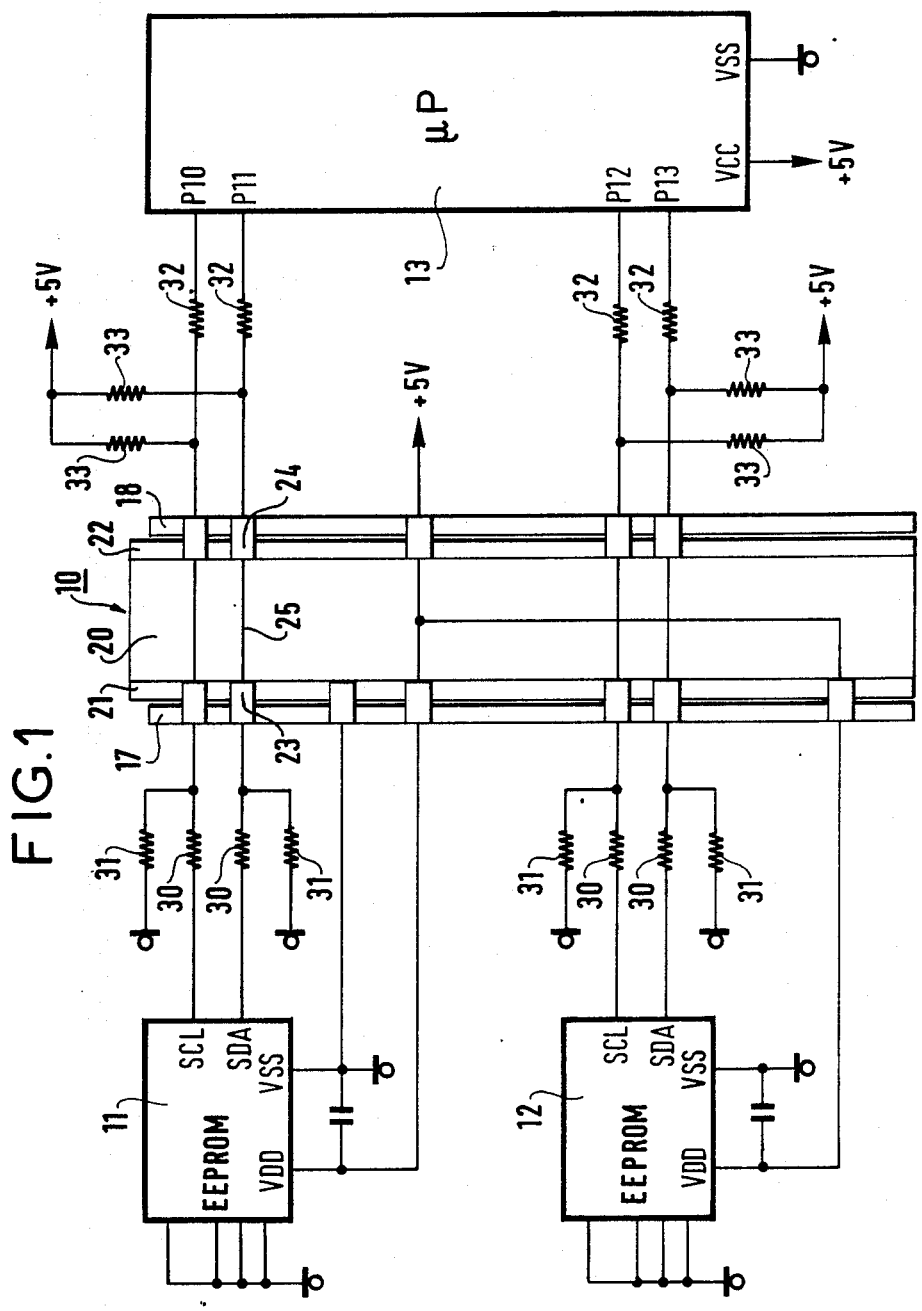
FIG. 1 shows a coupling circuit in accordance with the invention disposed between non-volatile memories and a microprocessor belonging to the electronic equipment of a machine.
Figure 2:
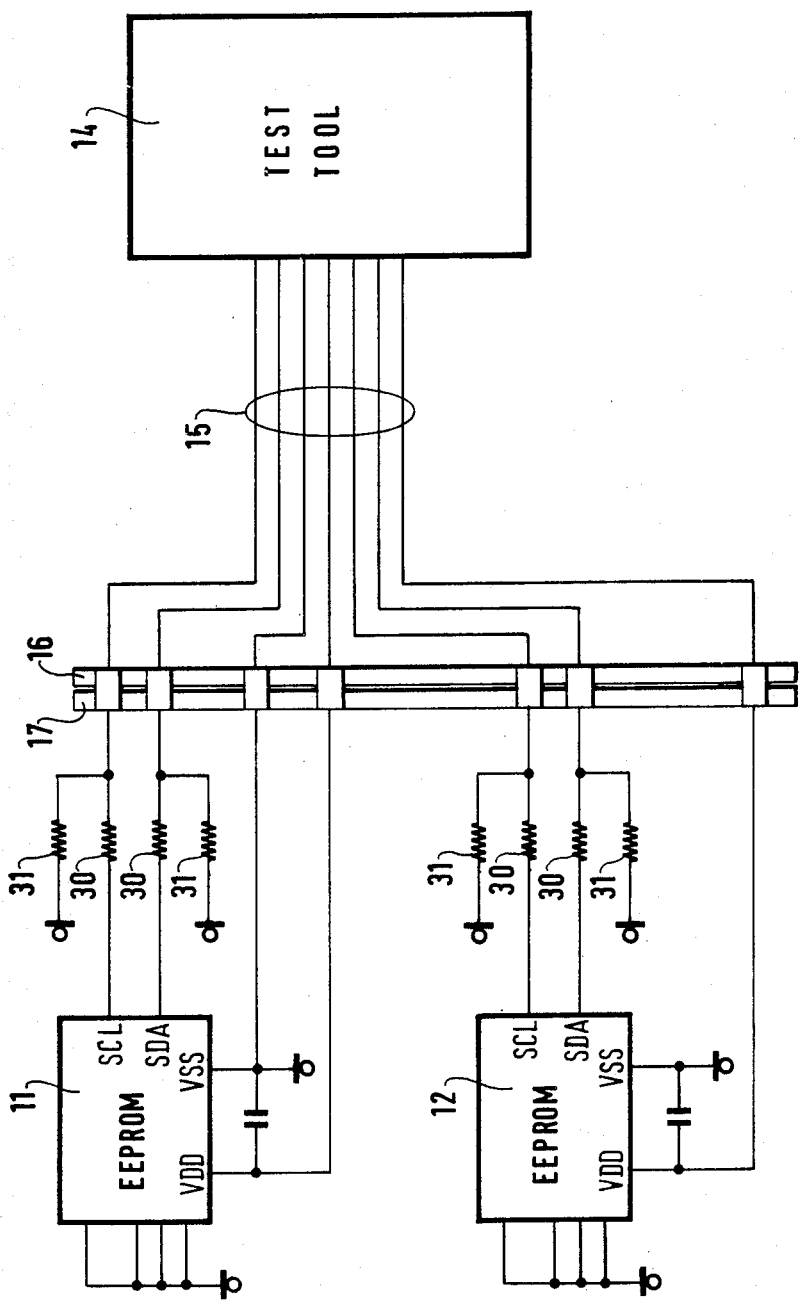
FIG. 2 shows a coupling circuit in accordance with the invention when in use for coupling the FIG. 1 non-volatile memories to a test tool.

In FIGS. 1 and 2, a coupling circuit 10 in accordance with the present invention is shown in use for providing selective coupling between two non-volatile memories 11 and 12 and a microprocessor 13 or between said two non-volatile memories and a test device referred to as a "test tool" 14. The test tool 14 has a multiconductor cable 15 fitted with a terminal connector 16 referred to as the "test connector".

FIGS. 1 and 2 show two serial-access non-volatile memories 11 and 12, and their active access terminals are marked as follows: VDD and VSS for the +5 V and the 0 V supply lines; SCL for the clock; and SDA for data.

These memories are electrically erasable programmable read only memories (EEPROM) such as type X2404 sold by XICOR.

In a variant, these memories are random access memories (RAM) backed-up by a battery, for example 8570 type memories sold by RTC or Signetics.

In FIG. 1, the active access terminals SCL and SDA of the two memories 11 and 12 are connected, separately for each memory, to corresponding access terminals P10, P11, P12, and P13 of the microprocessor 13, and active access terminals VDD and VSS are connected to the +5 volt supply line and ground for the electronic equipment as a whole, including the microprocessor, via individual links, which are not given individual references. These individual links are interrupted so that the coupling circuit 10 in accordance with the invention is inserted therein.

The coupling circuit 10 comprises a connector 17 which is complementary to the test connector 16 and which is fixed as a terminal connector on the links going to the memories. Another connector 18 is also fixed as a terminal connector on the links going to the microprocessor and to the +5 V source. Inbetween, a removable connector circuit 20 is mounted between the fixed connectors 17 and 18.

In each of the memories 11 and 12, each of the access terminals VDD, SDA, and SCL is connected to one of the pins of fixed connector 17. Access terminal VDD for each memory is directly connected to the corresponding pin of fixed connector 17, while the clock access terminals SCL and the data terminals SDA are connected via respective series resistors 30 to their respective individual pins on the fixed connector 17, with said resistors each having a resistance of 330 ohms. In addition, the clock and data links are pulled down to ground via respctive 22 K ohm resistors 31 each connected between the pin to which each of the links is connected and its series resistor 30.

In FIG. 1, the microprocessor 13 and both of the memories 11 and 12 have their ground access terminals VSS connected to a ground which is common for the entire equipment, as shown. This common ground is also connected to the coupling circuit 10 at one of the terminals of the fixed connector 17 on the memory side via the link between said pin and access terminal VSS of one of the memories, and in the example shown of the memory 11.

The fixed connector 17 thus has three individual pins on its memory side for each of the memories plus an additional pin at which the corresponding link to one of the memories provides the common ground of the assembly. For the two memories 11 and 12, it is therefore necessary to have a minimum of seven pins.

The access terminals P10 to P13 of the microprocessor are individually connected to four corresponding pins of fixed connector 18, each being connected via a 330 ohm series resistor 32. Each of these four links including a resistor 32 includes a 8.2 K ohm pull-up resistor 33 connected to the +5 V line. The +5 V source is directly connected to another pin of the connector 18.

The electronic equipment side of the fixed connector 18 has a minimum of five pins, with an additional common ground pin not being necessary on this side since the coupling circuit 10 as a whole is already connected to common ground.

The connection circuit 20 is in the form of a flat rectangular housing or is merely a substrate, and, as shown, it has its opposite long sides fitted with respective connectors 21 and 22. The connector 21 is complementary to fixed connector 17. In the example shown in FIGS. 1 and 2 it is identical to the test connector 16. The other connector 22 is complementary to fixed connector 18. In the connection circuit, pins such as 23 on one of the two connectors 21 and 22 are individually connected to corresponding pins such as 24 of the other connector via direct links such as 25 extending therebetween. They thus form pairs of interconnected pins which establish continuity between the links going to the memories and the links going to the microprocessor and the +5 V power supply, whenever the connection circuit 20 is in place.

In the connection circuit 20, the two pins of connector 21 for providing continuity between each of the memories 11 and 12 and the +5 V line are directly connected in common to the corresponding pin of connector 22. Connector 21 may have a pin corresponding to the ground pin of fixed connector 17, or it may omit such a pin.

Thus, if the removable connection circuit 22 is installed between fixed connectors 17 and 18, the memories 11 and 12 are coupled to the microprocessor and the +5 V power supply, as shown in FIG. 1, and data interchanges may take place between the microprocessor and the memories.

Advantageously, the serial type memories 11 and 12 allow for coupling to take place over a small number of links. The interchanges are then performed using a communications protocol defined by the memory manufacturer. For the serial access memories under consideration which require only two links between themselves and the microprocessor, the communications protocol is the Inter Integrated Circuits (I2C) bus protocol constituted by a two-wire bus having a data link and a clock link.

However, if the connection circuit 20 is disconnected from the fixed connector 17, it can be understood from FIG. 1, that the memories 11 and 12 are then completely isolated from one another and also from the remainder of the electronic equipment, in particular from the microprocessor and from the +5 V power supply. However, they remain connected to the common ground of the equipment.

In the embodiment shown in FIG. 1, the series resistors 30 and 32 serve to protect the memories 11 and 12 and the microprocessor 13 from the electric shocks that are inherently possible when the connection circuit 20 is installed or removed.

As shown in FIG. 2, when the connection circuit 20 is removed, it is possible to connect terminal connector 16 of the test tool 14 to the fixed connector 17 so as to connect it directly with the memory side links. In the example shown in FIG. 2, the multi-wire conductor cord 15 has seven wires connected to the seven individual pins of test connector 16. Under such conditions, each of the memories is powered independently from the other by the test tool, and the links between the test tool and the access terminal SCL and SDA of each of the memories are likewise separate.

The test tool can thus interrogate the memories separately in order to read their contents.

It may be observed that a five-wire cord could also be used instead of a seven-wire cord by providing a small printed circuit between the five-wire cord and the seven pin test connector 16, said printed circuit including a multiplexer chip for switching the three wires coming from the test tool to links going to the access terminals VDD, SCL and SDA of one or other of the memories. The fourth of the five wires in the tool is applied to the ground pin of the fixed connector 17 and the fifth wire is used for switching the test tool to one or other of the memories.

In a variant, the individual pins of the connector 17 may be in a different disposition from that shown. In particular, the ground pin may be central and the other pins for the links to access terminals VDD, VSS, and SCL of each of the memories may be disposed symmetrically about the central pin. Under such conditions, the test connector need only have four pins connected to the test tool by a four-wire cord: the connector can then be connected to one or other of the memories.

With the test tool coupled to one or other of the memories 11 and 12, the protocol used by the test tool is the same as the protocol used for interchanging data between the microprocessor and the memories. This protocol is advantageously the I2C bus protocol. The test procedure can make use of a clock signal at a frequency enabling the memories to be read slowly and is therefore compatible with a cord 15 which is several meters long. The serial resistors 30 on the links to the memories serve to provide protection against possible surges induced in the cord.

The insertion of the connector 17 which is complementary to the test connector 16 directly on the links between the serial access memories and the microprocessor (FIG. 1) makes it particularly easy to perform tests on the memories by means of the test tool. In particular, omitting links in parallel for the test connector as used in prior couplings, and using a limited number of conductors in the cord 15 of the test tool, as made possible by using serial access memories and the small number of pins on connector 17, make it possible to use a flexible cord of a comfortable length.

Figure 3:
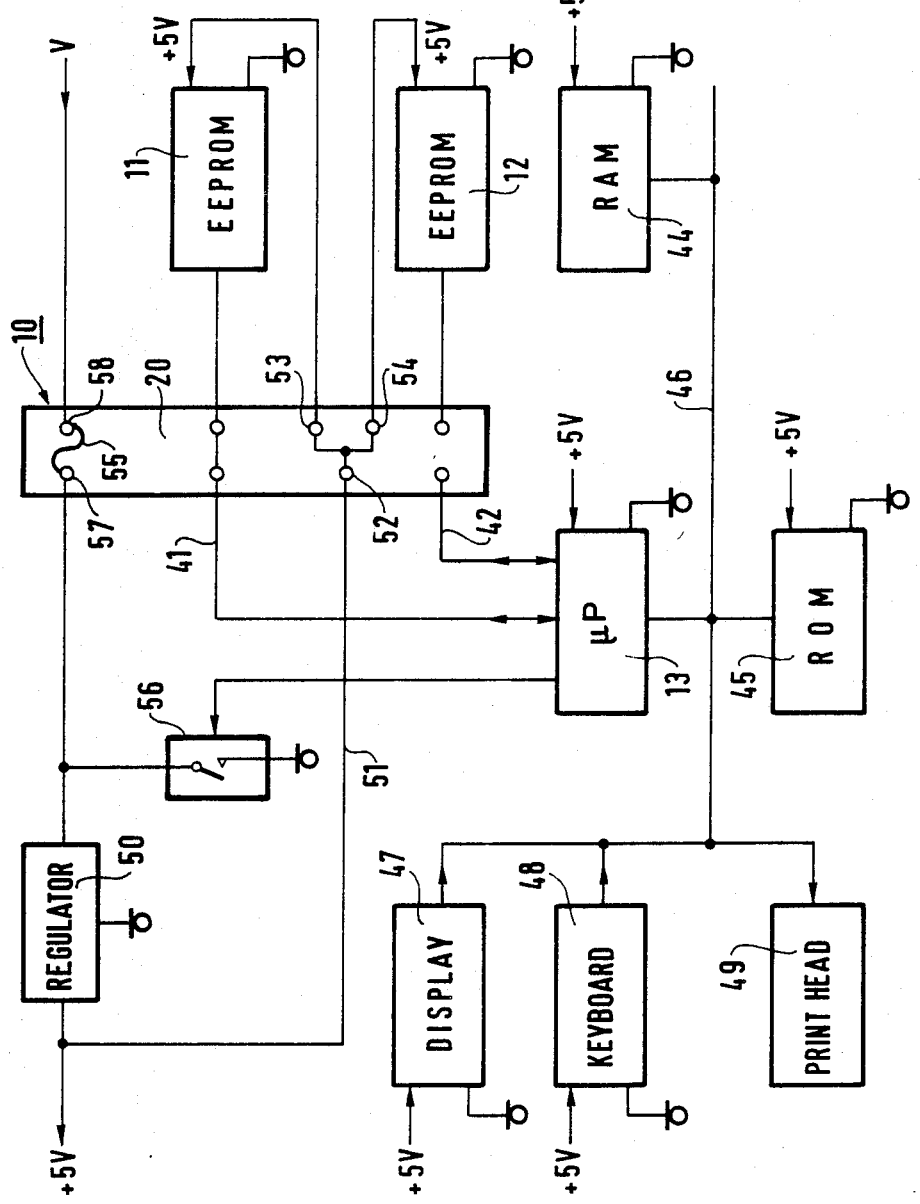
FIG. 3 is a block diagram of a franking machine equipped with said coupling circuits.

FIG. 3 is a block diagram of an electronic franking machine. Circuits comparable to those of FIG. 1 are designated therein by the same references.

The microprocessor 13 is the microprocessor on which the machine is organized. The above-mentioned memories 11 and 12 are the non-volatile memories for recording the states of the machine meters. They are coupled to the microprocessor 13 via a circuit 10 as in FIG. 1, setting up an independent two-wire bus between each of the memories and the microprocessor for transferring data and clock signals, so as to record the machine state in each of the memories over a separate path. In FIG. 3, the two-wire bus has the reference 41 for memory 11 and 42 for memory 12.

In FIG. 3, it can be seen that the machine further includes a working memory 44 and a control memory 45 connected to the microprocessor over a bus 46, a display 47, a keyboard 48, and a print head 49 also connected to the bus 46.

A regulator circuit 50 is also shown for delivering a regulated +5 V power supply to the electronic equipment and derived from a non-regulated source V. The +5 V regulated power supply is delivered to the memories via the coupling circuit as shown by a link 51 going from the circuit 50 and terminating at one of the pins 52 of the circuit 10. This pin 52 is connected to two pins 53 and 54 which are directly connected thereto and which are respectively connected to the memories 11 and 12. When the connection circuit 12 is removed, the non-volatile memories are isolated from the circuit 50.

In addition, in conventional manner, franking machines are provided with a locking member, in particular a fuse 55 interposed between the non-regulated source and the regulator circuit 50. This fuse is controlled by the microprocessor via a control circuit 56. It enables the machine to be locked up by cutting off the power supply to all of the equipment therein in the event of an anomaly being detected. One such anomaly is the detection of non-coincidence between the contents of the two non-volatile memories 11 and 12 prior to performing each franking operation. The fuse, and all of the machine equipment are enclosed within the machine and the machine enclosure is sealed when the machine is put into service.

In accordance with the invention, the fuse 55 may be mounted on the above-mentioned connection circuit 20 where it interconnects an additional connection pin 57 going to the power supply regulator 50 and an additional connection pin 58 going to the non-regulated power supply V. These additional pins 57 and 58 are mounted in the coupling circuit 10 which interposes the fuse between the regulated source 50 and the non-regulated source V, on a manner corresponding to the disposition shown in FIG. 11. As shown in FIG. 1 for the links between the memories and the microprocessor, each of these power supply pins belongs to one of the fixed connectors 17 and 18 and they are directly interconnected by the connection circuit.

In the event of a machine breakdown where a representative of the postal service services the machine, the machine is unsealed, the connection circuit 20 is removed for the test procedure, and the fuse mounted on the connection circuit is easily verified and changed when the machine is put back into operating condition. The machine is then resealed.

With reference to FIGS. 1 and 3, in a machine where the non-volatile memories 11 and 12 are selectively coupled in this way to the microprocessor, the microprocessor is suitable for detecting the presence or the absence of the connection circuit 20 on its links to the memories. The dispositions for detecting the presence or the absence of the connection circuit 20 are not shown in the figures. They are preferably constituted, each time the machine is powered up, or at least when the machine is put into service on being sealed, in a request to read a known byte contained in one or other of the non-volatile memories.

The response or failure to respond to this request indicates the presence or absence of the connection circuit 20. In the event of the connection circuit being absent, the microprocessor prevents franking from taking place.

The present invention has been described with reference to the accompanying FIGS. 1 to 3. It is clear, in practice, that the fixed connectors 17 and 18 could be mounted as a two-part connector mounted on the edge of the substrate on which the microprocessor and the non-volatile memories are mounted, or else it could be a double-sided connector printed on the edge of said substrate.

It is advantageously associated with keying means to ensure that the complementary connectors on the connection circuit or the test tool are put into place the right way round.

I claim:

1. A circuit for coupling non-volatile memories in an electronic machine, the circuit enabling said memories to be coupled to a microprocessor equipment of said machine and also to be coupled to an external test tool having a first terminal connector referred to as a test connector, the circuit comprising:
    links connected to the access terminals of said memories and to the access terminals of said equipment for coupling thereto; and
    a second connector complementary to the test connector and connected to said links;
    wherein said second connector is mounted directly as a terminal connector on said links going to said memories and interrupts their connection to said microprocessor equipment;
    wherein said circuit further includes a third connector mounted directly as a terminal connector on said links going to the microprocessor equipment, and also a connection circuit removably mounted between said second and third connectors, thereby selectably providing direct coupling between corresponding pins of the second and third connectors in order to ensure continuity in the links between the memories and the equipment when said connection circuit is interposed between said second and third connectors, and enabling the test connector to be connected to said second connector while isolating said memories from one another and from said equipment, when said connection circuit is removed therefrom.

2. A circuit according to claim 1, wherein said connection circuit is a flat circuit fitted with a fourth connector complementary to the second connector and with a fifth connector complementary to the third connector, and having direct interconnections between corresponding pins of said fourth and fifth connectors.

3. A coupling circuit according to claim 1, including series resistances on those of the links which go to the data and the clock access terminals of each of the memories and on those of the links going to the corresponding access terminals of the microprocessor.

4. A coupling circuit according to claim 1, including a pin on said second connector which is connected to the common ground of the equipment via a link to the ground access terminal of one of the memories thus ensuring that the connection circuit is connected to said common ground when it is interposed between said second and third connectors, and ensuring that said test tool is connected to said common ground when the test connector is connected to said second connector.

5. A franking machine comprising a microprocessor and two non-volatile memories for storing the machine state, said memories being connected to said microprocessor independently from each other in order to record the states of the machine meters in each of them, said franking machine further including a regulator circuit and a non-regulated power supply connected to said regulator circuit for powering the circuits in the machine, and said franking machine having a coupling circuit for coupling the memories to the microprocessor and for also enabling said memories to be coupled to an external test tool having a first terminal connector referred to as a test connector, said coupling circuit comprising links connected to the access terminals of said memories and to the access terminals of said equipment for coupling thereto, a second connector complementary to the test connector and connected to said links, wherein said second connector is mounted directly as a terminal connector on said links going to said memories and interrupts their connection to said microprocessor equipment, and said coupling circuit further including a third connector mounted directly as a terminal connector on said links going to the microprocessor equipment, and also a connection circuit removably mounted between said second and third connectors, thereby selectably providing direct coupling between corresponding pins of the second and third connectors in order to ensure continuity in the links between the memories and the equipment when said connection circuit is interposed between said second and third connectors, and enabling the test connector to be connected to said second connector while isolating said memories from one another and from said equipment, when said connection circuit is removed therefrom, wherein said memories are serial access memories and are coupled via said coupling circuit to the microprocessor via independent two-wire buses for each of them and to the power source via a pair of links going to each of the two memories and a common link going to said regulator circuit.

6. A franking machine according to claim 5, further including that any exchange of data and clock signals between the memories (11,12) and the microprocessor (13) on the one hand and between the memories (11,12) and the test tool on the other hand, in accordance with the coupling produced, takes place using a communications protocol known as the 12C bus protocol.

7. A franking machine according to claim 5, further including a locking member interposed on the link between the non-regulated voltage supply and said regulator circuit, and a control circuit for controlling said locking member and under the control of said microprocessor, wherein said locking member is mounted on said removable connection circuit where it is connected between two terminals attributed thereto, and wherein said second and third connectors each has one terminal for interposing said locking member in the link between the non-regulated source and said regulator circuit.

8. A franking machine according to claim 5, wherein the microprocessor includes means for detecting the presence of said connection circuit on its links with said memories in order to prevent franking from taking place in the absence of said connection circuit.

* * * * *